United States Patent
Lin et al.

(10) Patent No.: US 7,271,644 B2
(45) Date of Patent: Sep. 18, 2007

(54) MULTI-STATE ELECTRICAL FUSE

(75) Inventors: Yung-Lung Lin, Park Hsinchu (TW); Jui-Jen Wu, Hsinchu (TW); Hung-Jen Liao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 17 days.

(21) Appl. No.: 11/328,780

(22) Filed: Jan. 10, 2006

(65) Prior Publication Data
US 2007/0159231 A1 Jul. 12, 2007

(51) Int. Cl.
*H01H 37/76* (2006.01)
*H01H 85/00* (2006.01)

(52) U.S. Cl. .................... 327/525; 327/526; 365/225.7
(58) Field of Classification Search ................ 327/525, 327/526; 365/225.7
See application file for complete search history.

(56) References Cited

U.S. PATENT DOCUMENTS 5,966,339 A * 10/1999 Hsu et al. ................ 365/225.7
6,956,784 B1 * 10/2005 Laing ...................... 365/225.7
2005/0247996 A1 * 11/2005 Chung et al. ............... 257/529

* cited by examiner

*Primary Examiner*—Linh My Nguyen
*Assistant Examiner*—Diana J Cheng
(74) *Attorney, Agent, or Firm*—Kirkpatrick & Lockhart Preston Gates Ellis LLP

(57) ABSTRACT

An integrated circuit for programming an electrical fuse includes a first programming device coupled to the electrical fuse for selectively providing the same with a first programming current, and a second programming device coupled to the electrical fuse for selectively providing the same with a second programming current. A detection module is coupled to the electrical fuse for generating an output indicating a resistance level of the electrical fuse, wherein the resistance level has three or more predetermined states, which are provided by selectively programming the electrical fuse with the first or second programming current.

20 Claims, 3 Drawing Sheets

MULTI-STATE ELECTRICAL FUSE

BACKGROUND

The present invention relates generally to integrated circuit (IC) designs, and more particularly to a multi-state electrical fuse.

Electrical fuses are utilized by modern ICs for adjustments and repairs that are often made late in the IC fabricating process. The electrical fuse is designed to be programmed when a current flowing through the fuse exceeds a threshold, thereby causing its resistance to increase. The original and increased resistance values of the fuse can be used to represent two logic states, such as "0" and "1." Changing the fuse logic states can therefore be utilized for circuit adjustments and repairs.

Conventionally, the electrical fuse is designed to have only two states, programmed or not programmed. One drawback of the two-state electrical fuse is the layout inefficiency. As each fuse can only be programmed to represent a bit of data, a number of electrical fuses are needed for representing a corresponding number of bits. For example, eight electrical fuses are needed to represent a byte of data. Thus, a great number of electrical fuses are needed when a great number of data are needed to be programmed for circuit adjustments and repairs. These electrical fuses occupy a great amount of layout area, which becomes increasingly limited as the modern IC continues to shrink in size.

As such, desirable in the art of IC design is an electrical fuse that can be programmed to represent more than one bit of data in order for reducing the total number of fuses that need to be implemented in an IC.

SUMMARY

The present invention discloses an integrated circuit for programming an electrical fuse. In one embodiment of the present invention, the integrated circuit includes a first programming device coupled to the electrical fuse for selectively providing the same with a first programming current, and a second programming device coupled to the electrical fuse for selectively providing the same with a second programming current. A detection module is coupled to the electrical fuse for generating an output indicating a resistance level of the electrical fuse, wherein the resistance level has three or more predetermined states, which are provided by selectively programming the electrical fuse with the first or second programming current.

The construction and method of operation of the invention, however, together with additional objectives and advantages thereof will be best understood from the following description of specific embodiments when read in connection with the accompanying drawings.

DESCRIPTION

Figure 1:
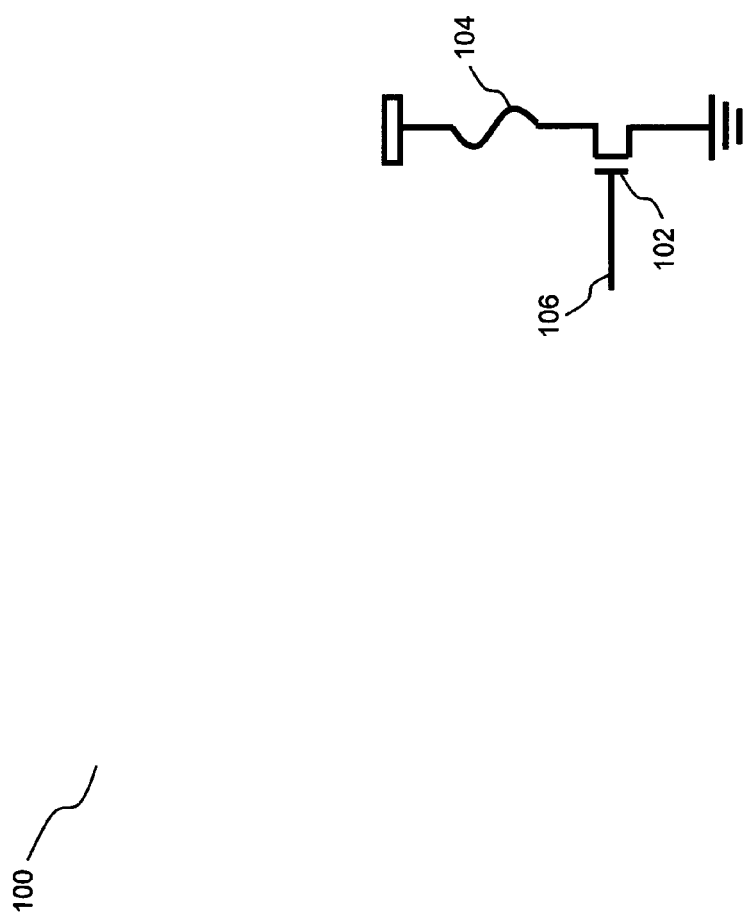
FIG. 1 schematically illustrates a conventional circuit for programming an electrical fuse.

FIG. 1 schematically illustrates a conventional circuit 100 for programming an electrical fuse 104 with a programming device 102. The programming device 102 is typically an N-type MOS transistor or a P-type MOS transistor. In this example, the programming device 102 is shown as an NMOS transistor. The electrical fuse 104 is placed between the programming device 102 and a supply source. When the electrical fuse 104 is selected to be programmed, a control signal will enter through a select line 106 to turn on the programming device 102, thereby allowing an electrical current flowing through the electrical fuse 104 to change its resistance.

One drawback of the conventional circuit 100 is the difficulty to reduce the number of electrical fuses implemented in an IC so that they often occupy a significant amount of layout area. Since the electrical fuse 104 represents only one bit of data by being programmed or not being programmed, a large number of the fuses will be required if a great number of data needs to be represented. As the modern IC continues to shrink in size, the layout area becomes increasingly limited and valuable. Thus, it is desirable to have an electrical fuse that can be programmed to represent more than one bit of data in order to reduce the total number of fuses that need to be implemented in an IC. This, in turn, reduces the layout area occupied by the fuses.

Figure 2:
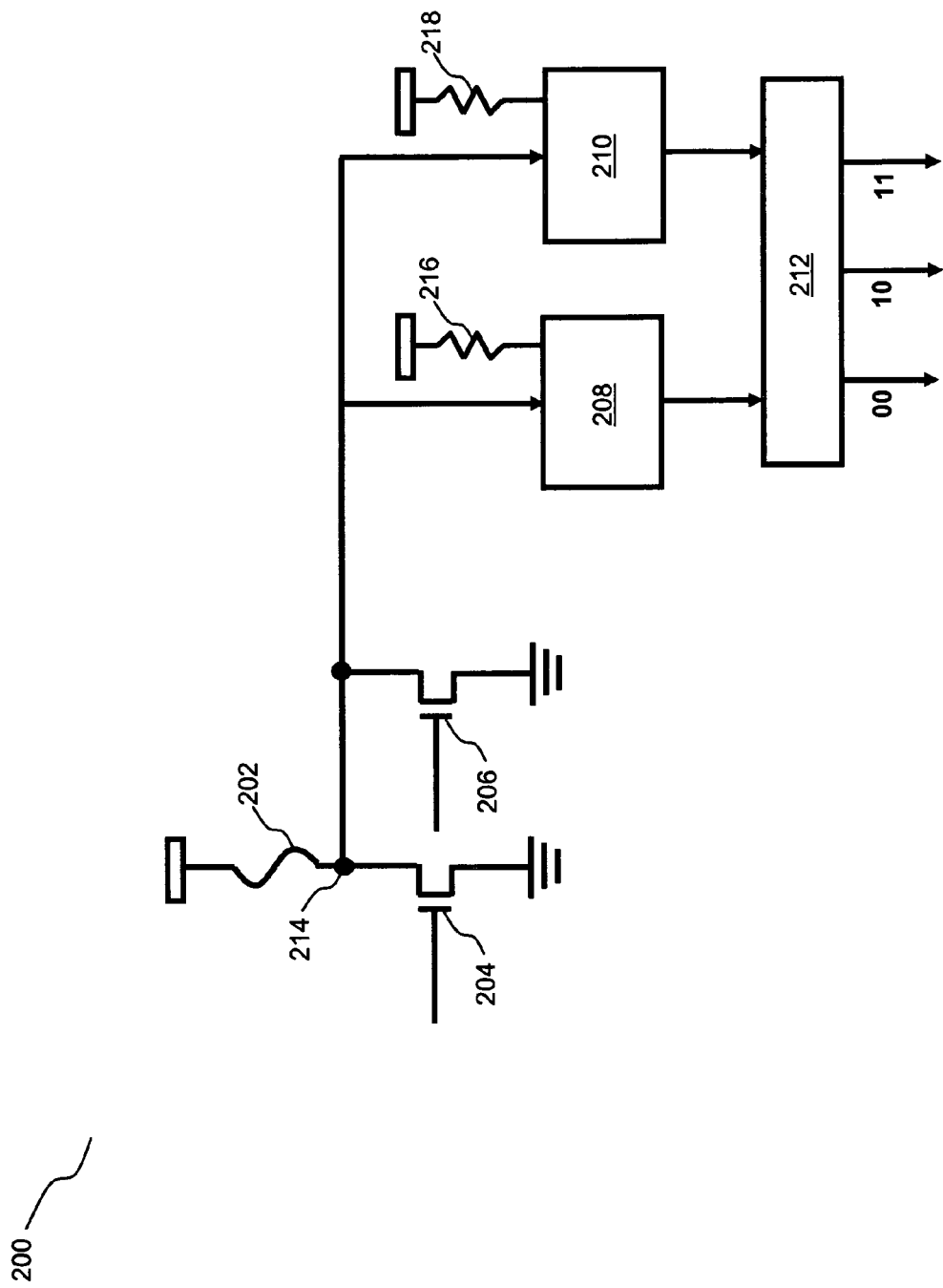
FIG. 2 schematically illustrates a circuit for programming an electrical fuse at multiple states in accordance with one embodiment of the present invention.

FIG. 2 schematically illustrates a circuit 200 for programming an electrical fuse 202 at multiple states in accordance with one embodiment of the present invention. The circuit 200 includes an electrical fuse 202, a first programming device 204, a second programming device 206 and a detection module, which is collectively represented by a first sense amplifier 208, a second sense amplifier 210, and a logic device 212. The first programming device 204 and the second programming device 206 are coupled to the electrical fuse 202 at a node 214 in a parallel fashion.

The first programming device 204 is designed to program the electrical fuse 202 by providing the electrical fuse 202 with a first programming current, while the second programming device 206 is designed to program the electrical fuse 202 by providing the electrical fuse 202 with a second programming current. The first programming current is designed to be significantly smaller than the second programming current. For example, the first programming device 204 can be an NMOS transistor that is smaller in physical size than the second programming device 206, which can also be an NMOS transistor. Thus, the second programming device 206 would allow more current flowing from a supply source to ground through the electrical fuse 202 than the first programming device 204 does.

Unlike the electrical fuse 104 shown in FIG. 1, the electrical fuse 202 is capable of being programmed into three or more possible logic states. The electrical fuse 202 is at a first logic state, which is represented by having its resistance at a lowest level, when the first and second programming devices 204 and 206 are not selected. The electrical fuse 202 is at a second logic state, which is represented by having its resistance at a middle level, when the first programming device 204 is selected to program the fuse 202 with the first programming current, while the second programming device 206 is unselected. Similarly, the electrical fuse 202 is at a third logic state, which is represented by having its resistance a high level, when the second programming device 206 is selected to program the fuse 202, while the first programming device 204 is unselected.

The first and second sense amplifiers 208 and 210 are also coupled to the node 214 for detecting the resistance level of the electrical fuse 202. The first and second sense amplifiers 208 and 210 are coupled respectively to first and second reference resistors 216 and 218. By comparing the resistance value of the electrical fuse 202 with those of the first and second reference resistors 216 and 218, the first and second sense amplifiers 208 and 210 can determine the resistance level of electrical fuse 202. For example, if the electrical fuse 202 is not programmed, its resistance value will be lower than those of the reference resistors 216 and 218, and each of the two sense amplifiers 208 and 210 will correspondingly output a "0." If the electrical fuse 202 is programmed by selecting the first programming device 204, its resistance value will be higher than that of the first reference resistor 216 and lower than that of the second reference resistor 218. In such case, the first sense amplifier 208 will output a "1" and the second sense amplifier 210 will output a "0." If the electrical fuse 202 is programmed by selecting the second programming device 206, its resistance value will be higher than those of the first and second reference resistors 216 and 218, and each of the sense amplifiers 208 and 210 will correspondingly output a "1." The outputs of the sense amplifiers 208 and 210 are received by the logic device 212 where a logic state of the electrical fuse 202 can be provided as "00," "10," or "11."

Note that while this embodiment presents an electrical fuse that can be programmed at three logic states, the number of logic states at which the fuse can be programmed is by no means limited to three. For example, three or more programming devices of various sizes can be used for programming the electrical fuses at more than three different resistance levels, and three or more sense amplifiers can be coupled to the electrical fuse for detecting its various resistance levels.

Figure 3:
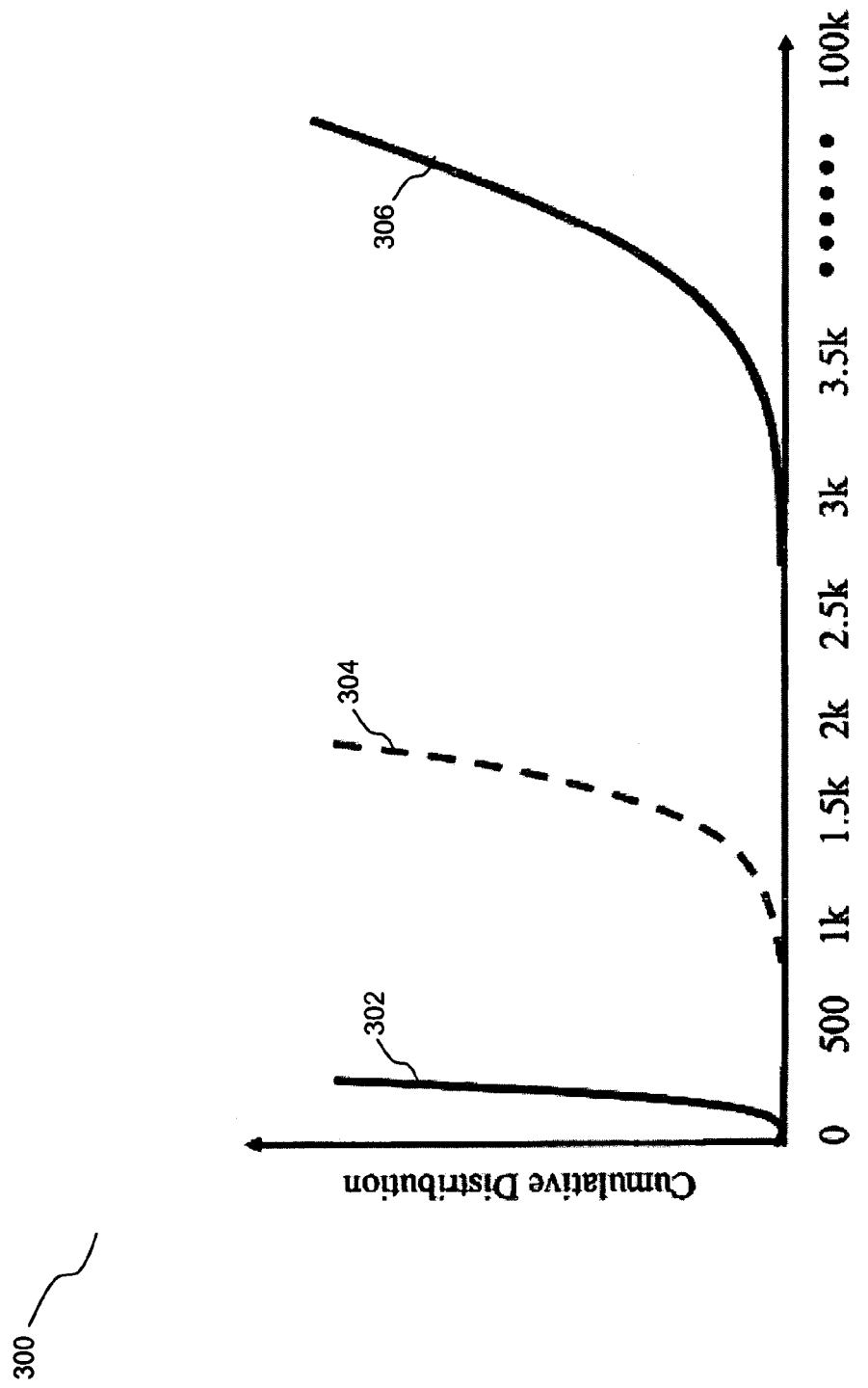
FIG. 3 illustrates a graph showing various states of the electrical fuse programmed by the proposed circuit in accordance with one embodiment of the present invention.

FIG. 3 illustrates a graph 300 showing various states of the electrical fuse programmed by the proposed circuit in accordance with one embodiment of the present invention. Referring simultaneously to FIGS. 2 and 3, the graph 300 shows the cumulative distribution for the electrical fuse 202 being programmed by the first programming device 204, the second programming device 206, or none of those devices at all. A curve 302 is used to show the cumulative distribution of the electrical fuse 202 that has not been programmed, in which the electrical fuse 202 has a resistance about 100%. A curve 304 is used to show the cumulative distribution of the electrical fuse 202 programmed by selecting the first programming device 204, in which the electrical fuse 202 has a resistance about 1.5 kΩ. A curve 306 is used to show the cumulative distribution of the electrical fuse 202 programmed by selecting the second programming device 206, in which the resistance of the electrical fuse 202 is about 3.5kΩ. Thus, it is shown that the electrical fuse 202 can be programmed at three possible states.

The present invention allows an electrical fuse to be programmed at three or more states, thereby reducing the number of fuses that must be implemented to represent a set of data as opposed to the conventional electrical fuse. For example, while two conventional electrical fuses are required to represent three logic states, only one proposed electrical fuse is required to represent them. This helps to reduce the layout area occupied by the electrical fuses in an IC.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit for programming an electrical fuse, comprising:
   a first programming device coupled to the electrical fuse for selectively providing the same with a first programming current;
   a second programming device coupled to the electrical fuse for selectively providing the same with a second programming current; and
   a detection module coupled to the electrical fuse for generating an output indicating a resistance level of the electrical fuse,
   wherein the detection module comprises a logic device providing a first logic state when the first and second programming devices are not selected, a second logic state when the first programming device is selected to program the electrical fuse while the second programming device is unselected, and a third logic state when the second programming device is selected to program the electrical fuse while the first programming device is unselected.

2. The integrated circuit of claim 1, wherein the first programming current is substantially smaller than the second programming current.

3. The integrated circuit of claim 1, wherein the first programming device and the second programming device are connected in parallel.

4. The integrated circuit of claim 1, wherein the first programming device is smaller in physical size than the second programming device.

5. The integrated circuit of claim 1, wherein the detection module comprises a first sense amplifier coupled to the electrical fuse and a first reference resistor for generating a first sense amplifier output indicating if the resistance level of the electrical fuse is greater than that of the first reference resistor.

6. The integrated circuit of claim 5, wherein the detection module comprises a second sense amplifier coupled to the electrical fuse and a second reference resistor for generating a second sense amplifier output indicating if the resistance level of the electrical fuse is greater than that of the second reference resistor.

7. The integrated circuit of claim 6, wherein the resistance level of the electrical fuse is lower than those of the first and second reference resistors when the electrical fuse is not programmed by either the first programming current or the second programming current.

8. The integrated circuit of claim 7, wherein the resistance level of the electrical fuse is higher than that of the first reference resistor but lower than that of the second reference resistor when the electrical fuse is programmed by the first programming current.

9. The integrated circuit of claim 8, wherein the resistance level of the electrical fuse is higher than those of the first and second reference resistors when the electrical fuse is programmed by the second programming current.

10. The integrated circuit of claim 6, wherein the logic device is coupled to the first and second sense amplifiers for generating the output of the detection module in response to the first and second sense amplifier outputs.

11. An integrated circuit for programming an electrical fuse, comprising:
- a first programming device coupled to the electrical fuse for selectively providing the same with a first programming current;
- a second programming device coupled to the electrical fuse for selectively providing the same with a second programming current;
- a first sense amplifier coupled to the electrical fuse and a first reference resistor for generating a first sense amplifier output indicating if a resistance level of the electrical fuse is greater than that of the first reference resistor;
- a second sense amplifier coupled to the electrical fuse and a second reference resistor for generating a second sense amplifier output indicating if the resistance level of the electrical fuse is greater than that of the second reference resistor; and
- a detection module comprising a logic device providing a first logic state when the first and second programming devices are not selected, a second logic state when the first programming device is selected to program the electrical fuse while the second programming device is unselected, and a third logic state when the second programming device is selected to program the electrical fuse while the first programming device is unselected.

12. The integrated circuit of claim 11, wherein the first programming current is substantially smaller than the second programming current.

13. The integrated circuit of claim 11, wherein the first programming device and the second programming device are connected in parallel.

14. The integrated circuit of claim 11, wherein the first programming device is smaller in physical size than the second programming device.

15. The integrated circuit of claim 14, wherein the resistance level is at the first state when the electrical fuse is not programmed by either the first programming current or the second programming current.

16. The integrated circuit of claim 15, wherein the resistance level is at the second state when the electrical fuse is programmed by the first programming current.

17. The integrated circuit of claim 16, wherein the resistance level is at the third state when the electrical fuse is programmed by the second programming current.

18. A device for programming an electrical fuse, comprising:
- a first programming device coupled to the electrical fuse for selectively providing the same with a first programming current;
- a second programming device coupled to the electrical fuse for selectively providing the same with a second programming current;
- a first sense amplifier coupled to the electrical fuse and a first reference resistor for generating a first sense amplifier output indicating if a resistance level of the electrical fuse is greater than that of the first reference resistor;
- a second sense amplifier coupled to the electrical fuse and a second reference resistor for generating a second sense amplifier output indicating if the resistance level of the electrical fuse is greater than that of the second reference resistor; and
- a detection module comprising a logic device coupled to the first and second sense amplifiers for generating an output indicating the resistance level of the electrical fuse in response to the first and second sense amplifier outputs,
- wherein the detection module provides a first logic state when the first and second programming devices are not selected, a second logic state when the first programming device is selected to program the electrical fuse while the second programming device is unselected, and a third logic state when the second programming device is selected to program the electrical fuse while the first programming device is unselected.

19. The device of claim 18, wherein the first programming current is substantially smaller than the second programming current.

20. The device of claim 19, wherein the resistance level is at the first state when the electrical fuse is not programmed by either the first programming current or the second programming current, at the second state when the electrical fuse is programmed by the first programming current, and at the third state when the electrical fuse is programmed by the second programming current.

* * * * *